(12) United States Patent
Kida et al.

(10) Patent No.: US 9,434,876 B2
(45) Date of Patent: Sep. 6, 2016

(54) PHOSPHOR-DISPERSED GLASS

(71) Applicant: Central Glass Company, Limited, Ube-shi, Yamaguchi (JP)

(72) Inventors: Takahisa Kida, Matsusaka (JP); Jun Hamada, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/920,560

(22) Filed: Oct. 22, 2015

(65) Prior Publication Data

US 2016/0115379 A1 Apr. 28, 2016

(30) Foreign Application Priority Data

Oct. 23, 2014 (JP) .................. 2014-216113
Sep. 30, 2015 (JP) .................. 2015-193161

(51) Int. Cl.
*H01L 33/50* (2010.01)
*C09K 11/02* (2006.01)
*C09K 11/77* (2006.01)
*C09K 11/58* (2006.01)

(52) U.S. Cl.
CPC .............. *C09K 11/02* (2013.01); *C09K 11/584* (2013.01); *C09K 11/7734* (2013.01); *C09K 11/7774* (2013.01); *H01L 33/502* (2013.01)

(58) Field of Classification Search
CPC ... H01L 33/502; C09K 11/02; C09K 11/584; C09K 11/7734; C09K 11/7774
See application file for complete search history.

(56) References Cited

U.S. PATENT DOCUMENTS

| 7,052,352 B2* | 5/2006 | Rasmussen | H01J 31/127 445/23 |
| 7,319,289 B2* | 1/2008 | Suehiro | H01L 33/501 257/E33.059 |
| 7,963,817 B2* | 6/2011 | Kameshima | C03C 14/004 313/512 |
| 8,148,886 B2 | 4/2012 | Sakata et al. | |
| 8,354,790 B2 | 1/2013 | Iwanaga | |
| 2005/0253113 A1* | 11/2005 | Letz | C03C 3/062 252/301.4 P |
| 2008/0128726 A1 | 6/2008 | Sakata et al. | |
| 2008/0284310 A1* | 11/2008 | Suehiro | H01L 33/56 313/498 |
| 2009/0278147 A1* | 11/2009 | Suzuki | H01L 33/56 257/98 |
| 2009/0284148 A1 | 11/2009 | Iwanaga | |
| 2010/0201254 A1* | 8/2010 | Matsumura | H01L 33/387 313/501 |
| 2010/0203658 A1* | 8/2010 | Aida | H01L 33/52 438/27 |
| 2015/0001563 A1* | 1/2015 | Miki | H01L 33/54 257/98 |
| 2015/0097166 A1* | 4/2015 | Setz | C03C 17/04 257/40 |
| 2015/0315427 A1* | 11/2015 | Yoshida | C09J 143/04 257/791 |

FOREIGN PATENT DOCUMENTS

| JP | 2003-258308 A | 9/2003 |
| JP | 2005-11933 A | 1/2005 |
| JP | 2007-191702 A | 8/2007 |
| JP | 2007-302858 A | 11/2007 |
| JP | 2009-177131 A | 8/2009 |
| JP | 2009-277516 A | 11/2009 |
| JP | 2012-155003 A | 8/2012 |
| JP | 5045432 B2 | 10/2012 |

OTHER PUBLICATIONS

Yeh, et al. "Origin of Thermal Degradation of $Sr_{2-x}Si_5N_8:Eu_x$ Phosphors in Air for Light-Emitting Diodes", Journal of the American Chemical Society, 134, Jul. 25, 2012, pp. 14108-14117, (Ten (10) pages).

* cited by examiner

*Primary Examiner* — Ida M Soward
(74) *Attorney, Agent, or Firm* — Crowell & Moring LLP

(57) ABSTRACT

Disclosed is a phosphor-dispersed glass, including: a glass material; and a phosphor dispersed in the glass material, wherein the glass material is substantially free of $Nb_2O_5$ and contains: 15 to 40 mass % of $SiO_2$; 10 to 30 mass % of $B_2O_3$; 1 to 35 mass % of ZnO; 0 to 20 mass % of $Al_2O_3$; 2 to 30 mass % in total of at least one kind selected from the group consisting of BaO, CaO and SrO; 0 to 1 mass % of MgO; 5 to 35 mass % in total of $R_2O$ (at least one selected from the group consisting of $Li_2O$, $Na_2O$ and $K_2O$); and 0 to 15 mass % in total of at least one of antimony oxide and tin oxide.

7 Claims, No Drawings

PHOSPHOR-DISPERSED GLASS

FIELD OF THE INVENTION

The present invention relates to a phosphor-dispersed glass having, dispersed in a glass material, a phosphor capable of converting a wavelength of light.

BACKGROUND OF THE INVENTION

Conventionally widely known are light emitting devices, each of which utilizes a light emitting diode (LED) or laser diode (LD) as a light source, converts a wavelength of emission light from the light source and thereby generate light of desired color or wavelength, as discussed in Patent Documents 1 to 4.

In recent years, various light emitting devices using LEDs or LDs as light sources have been developed. As one such type of light emitting device, there has been developed a light emitting device that emits white light by the use of e.g. LED as a light source and realizes power-saving performance and high-color-rendering properties. In general, currently commercially available white light emitting devices utilize blue GaN LEDs as light sources in combination of yellow phosphors so as to convert parts of blue emission light from the LEDs to yellow light by the action of the yellow phosphors, mix the blue emission light with the converted yellow light and generate pseudo white light. Cerium-doped YAG oxide phosphors are widely used as the above yellow phosphors.

In the case of using a phosphor in combination with a LED or LD light source, it is common practice to seal the light source with a mixture of the phosphor and an encapsulating resin such as epoxy resin, silicon resin or fluorine resin. In this case, there is a problem that the resin may be deteriorated due to heat generation from the LED or LD or by ultraviolet or blue light radiation from the LED or LD to cause discoloration, deterioration of light transmission characteristics etc. Depending on the kind of the phosphor, there is also a problem that the phosphor may be damaged and deactivated by the entry of ambient moisture through the encapsulating resin.

Under these circumstances, attention is being focused on the use of glass materials as encapsulants in view of the fact that the glass materials have higher resistance to heat and light than resin materials and show high water-barrier properties. For example, it is conceivable to mix a glass powder with a phosphor powder, sinter the glass-phosphor powder mixture and seal a LED with the sintered glass-phosphor body (also referred to as "phosphor-dispersed glass"). As an application example of such seal structure, Patent Document 5 discloses a white light emitting device that utilizes a sintered body formed by mixing a $SnO$—$P_2O_5$—$ZnO$ glass powder with an oxide phosphor powder and sintering the glass-phosphor powder mixture. Patent Document 6 discloses a weather-resistant emission color conversion material that utilizes a $SiO_2$—$TiO_2$—$Nb_2O_5$—$R_2O$ (R=Li, Na, K) glass composition substantially free of PbO and having a softening point of 650° C. or lower.

Patent Document 5 discloses a method of sealing a LED with the use of a glass powder and a phosphor powder by sintering the glass-phosphor powder mixture into a phosphor-dispersed glass, placing the phosphor-dispersed glass on the LED, softening the phosphor-dispersed glass and thereby allowing the phosphor-dispersed glass to flow over and seal the LED, or by densely covering the LED with the glass-phosphor powder mixture, softening the glass-phosphor powder mixture and thereby allowing the glass-phosphor powder mixture to flow over and seal the LED simultaneously with forming the glass-phosphor mixture into a phosphor-dispersed glass. Patent Document 6 discloses a method of sealing a LED with the use of a glass powder and a phosphor powder by kneading the glass powder and the phosphor powder together with a binder, a solvent and the like, applying the resulting paste to the LED and sintering the applied paste into a phosphor-dispersed glass so as to allow sealing of the LED simultaneously with formation of the phosphor-dispersed glass, or by forming a green sheet of the same material as the above glass-phosphor paste, stacking the green sheet on the LED, thermocompression bonding the green sheet to the LED and then sintering the green sheet.

Further, Patent Document 7 discusses that a sulfide phosphor, an aluminate phosphor and a silicate phosphor are inferior in moisture resistance and thus proposes a method of producing a phosphor-dispersed glass by mixing a powder of such a phosphor with a glass powder and sintering the glass-phosphor powder mixture, rather than by a sol-gel technique using water, so as to prevent damage of the phosphor by water during production of the phosphor-dispersed glass.

By sealing the light source such as LED or LD with the phosphor-dispersed glass in which the phosphor is dispersed in the glass material as mentioned above, it is possible to solve the problem of the conventional resin seal structure and realize the light emitting device with improved resistance to heat, light and ambient moisture. However, the glass-phosphor powder mixture needs to be sintered by heating at a temperature higher than or equal to the glass transition temperature for production of the phosphor-dispersed glass and sealing of the light source. There is a possibility that the phosphor may be deactivated by such heating.

It has been reported that a nitride phosphor is deactivated when heated in the presence of oxygen. For example, Non-Patent Document 1 reports that, when a $Sr_{2-x}Si_5N_8$:$Eu^{2+}$ phosphor is heated in the presence of oxygen, $Eu^{2+}$ of the phosphor is oxidized to $Eu^{3+}$. In other words, there is a problem that the nitrogen phosphor may significantly decrease in emission efficiency during sintering of a mixture of the nitrogen phosphor with an oxygen-containing glass material.

In addition to the above problem of the nitrogen phosphor, there is also a problem that a sulfide phosphor, a halide phosphor and an aluminate phosphor significantly decrease in emission efficiency due to heat during sintering of a mixture of a powder of the phosphor with a glass powder. Patent Document 8 thus discloses a phosphor-dispersed glass in which a low heat-resistant phosphor of the above type is dispersed in a $Zn$—$B_2O_3$—$SiO_2$ glass material having a softening point of about 600° C. so as to suppress deactivation of the phosphor during sintering of a mixture of a powder of the phosphor with a powder of the glass material.

PRIOR ART DOCUMENTS

Patent Document 1: Japanese Laid-Open Patent Publication No. 2009-277516
Patent Document 2: Japanese Laid-Open Patent Publication No. 2012-155003
Patent Document 3: Japanese Laid-Open Patent Publication No. 2003-258308
Patent Document 4: Japanese Patent No. 5045432

Patent Document 5: Japanese Laid-Open Patent Publication No. 2005-11933

Patent Document 6: Japanese Laid-Open Patent Publication No. 2007-302858

Patent Document 7: Japanese Laid-Open Patent Publication No. 2009-177131

Patent Document 8: Japanese Laid-Open Patent Publication No. 2007-191702

Non-Patent Document 1: Yeh C W et al., "Origin of thermal degradation of Sr(2-x)Si5N8:Eu(x) phosphors in air for light-emitting diodes", J. Am. Chem. Soc., 134, 14108-14117(2012).

SUMMARY OF THE INVENTION

In the case of using the phosphor-dispersed glass as the sealing material for sealing of the light source such as LED or LD, there is a possibility that the phosphor may be deactivated due to heat during sintering of the glass-phosphor powder mixture or during sealing of the light source by heating of the phosphor-dispersed as mentioned above. It is thus preferable to use a low softening glass material as the glass material. On the other hand, the low softening glass material may be low in weather resistance, particularly moisture resistance, and become chemically unstable. When the glass material is low in moisture resistance, there is a problem that glass component may be eluted or deposited as a salt during long-term use. This results in a deterioration of emission efficiency by decrease of light transmittance.

For example, Patent Document 6 discloses a weather-resistant emission color conversion material using a $SiO_2$—$TiO_2$—$Nb_2O_5$—$R_2O$ oxide glass composition. In the emission color conversion material, the oxide glass composition attains weather resistance, particularly moisture resistance, with the addition of $TiO_2$ and $Nb_2O_5$ as essential glass components.

However, $Nb_2O_5$ is expensive as a raw material compound for glass production. The use of such an expensive raw material compound leads to high production cost. There is thus a strong demand to provide a phosphor-dispersed glass with improved moisture resistance even without the use of an expensive raw material compound such as $Nb_2O_5$.

It is accordingly an object of the present invention to provide a phosphor-dispersed glass having high moisture resistance even without the use of $Nb_2O_5$ as a glass component.

It is generally known that an alkali metal and an alkaline-earth metal are not favorable as components to improve the moisture resistance of a glass material due to the reasons that: when the alkali metal is contained in the glass material, the alkali metal is eluted from a surface of the glass material by moisture in the air; and when the alkaline-earth metal is contained in the glass material, the alkaline-earth metal is deposited as a salt on a surface of the glass material by moisture in the air. As mentioned above, the light transmittance of the glass material decreases by such alkali elution or salt deposition so that the glass material deteriorates in emission efficiency even without the occurrence of deactivation of the phosphor in the glass material.

As a result of extensive researches, however, the present inventors have found that it is possible to significantly improve the moisture resistance of a glass material by increasing the content of BaO in the glass material. The present inventors have also made researches on the use of other alkaline-earth metals and found that: it is possible to obtain the same moisture resistance improvement tendency as above by the use of CaO and SrO; and the use of MgO as a glass component leads to a significant loss of glass moisture resistance.

Namely, there is provided according to the present invention a phosphor-dispersed glass, comprising: a glass material; and a phosphor dispersed in the glass material, wherein the glass material is substantially free of $Nb_2O_5$ and contains: 15 to 40 mass % of $SiO_2$; 10 to 30 mass % of $B_2O_3$; 1 to 35 mass % of ZnO; 0 to 20 mass % of $Al_2O_3$; 2 to 30 mass % in total of at least one kind selected from the group consisting of BaO, CaO and SrO; 0 to 1 mass % of MgO; 5 to 35 mass % in total of $R_2O$ (at least one selected from the group consisting of $Li_2O$, $Na_2O$ and $K_2O$); and 0 to 15 mass % in total of at least one of antimony oxide and tin oxide.

It has been found that, although the moisture resistance of the glass material can be improved by increasing the content of BaO in the glass material as mentioned above, the external quantum efficiency of the phosphor tends to decrease with increase in the BaO content of the glass material. It has also been found that the external quantum efficiency of the phosphor can be increased by increasing the content of $B_2O_3$ in the glass material although the moisture resistance of the glass material tends to deteriorate with increase in the $B_2O_3$ content of the glass material. Based on these findings, the present invention enables the glass material to ensure both of good moisture resistance and good emission efficiency by controlling the contents of the respective glass components to within the above specific ranges.

In the present specification, the moisture resistance of the glass material is evaluated by the flowing moisture resistance test. The phosphor-dispersed glass is regarded as being high in moisture resistance when the moisture resistance of the glass material is high.

First, a glass powder is compressed in a mold and thereby preformed into a button shape with a diameter of 20 mm and a thickness of 2 mm. The preformed glass sample is sintered by heating for 30 minutes in the air. The sintered glass sample is subjected to grinding to a thickness of 1 mm. Before the moisture resistance evaluation test, the ultraviolet-visible light transmittance (550 nm) of the sintered glass sample is measured with a spectrophotometer (U 4000 manufactured by Hitachi Cooperation).

Next, the moisture resistance evaluation test is performed on the sintered glass sample. In the moisture resistance evaluation test, the sintered glass sample is left under the PCT (pressure cooker test) conditions of a temperature of 121° C. and a humidity of 100% for 24 hours, 48 hours, 72 hours or 96 hours. After the moisture resistance evaluation test, the ultraviolet-visible light transmittance of the sintered glass sample is measured in the same manner as above.

Based on the light transmittance measurement results, the rate of decrease of the light transmittance during the moisture resistance evaluation test is determined by the formula: {1−(light transmittance after moisture resistance evaluation test/light transmittance before moisture resistance evaluation test)}×100(%). In the present specification, the moisture resistance was evaluated as: good (○) when the rate of decrease of the light transmittance was 1% or smaller; and poor (X) when the rate of decrease of the light transmittance exceeded 1%.

The phosphor-dispersed glass of the present invention can be obtained by preparing a powder of the above glass material, mixing the powder of the glass material with the phosphor and sintering the glass-phosphor powder mixture.

It is possible by the present invention to provide the phosphor-dispersed glass with high moisture resistance without the use of an expensive raw material compound such as $Nb_2O_5$.

DESCRIPTION OF EMBODIMENTS

The phosphor-dispersed glass of the present invention includes a glass material and a phosphor dispersed in the glass material, characterized in that the glass material is substantially free of $Nb_2O_5$ and contains 15 to 40 mass % of $SiO_2$, 10 to 30 mass % of $B_2O_3$, 1 to 35 mass % of ZnO, 0 to 20 mass % of $Al_2O_3$, 2 to 30 mass % in total of at least one kind selected from the group consisting of BaO, CaO and SrO, 0 to 1 mass % of MgO; 5 to 35 mass % in total of $R_2O$ (at least one selected from the group consisting of $Li_2O$, $Na_2O$ and $K_2O$) and 0 to 15 mass % in total of at least one of antimony oxide and tin oxide.

Hereinafter, the composition of the glass material of the present invention will be described below.

In the present invention, the glass material contains $SiO_2$, $B_2O_3$, ZnO, $Al_2O_3$, BaO, CaO, SrO, $R_2O$, antimony oxide and tin oxide as glass components. The total amount of these glass components is basically 100 mass %. However, any optional component(s) commonly usable as glass component may alternatively be added in an amount of up to about 15 mass %.

Examples of the optional component are ordinary oxides such as $WO_3$, $CeO_2$ and the like.

As mentioned above, the moisture resistance of the glass material is improved without the addition of an expensive glass component such as $Nb_2O_5$. Herein, the expression "substantially free" means that the content of $Nb_2O_5$ in the glass material is e.g. less than 0.01 mass % or means that $Nb_2O_5$ is not intentionally added during production of the glass material or during production of the phosphor-dispersed glass.

Each of $Nb_2O_5$ and $TiO_2$ has an absorption band in an ultraviolet wavelength region so that, depending on the kind of a light source employed, the existence of $Nb_2O_5$ or $TiO_2$ may cause a deterioration of emission efficiency. For this reason, it is preferable that the glass material is substantially free of $Nb_2O_5$ and $TiO_2$ so as to, in the case of using e.g. an ultraviolet light source, suppress undesired absorption of excitation light by the glass material. For example, the total content of $Nb_2O_5$ and $TiO_2$ may be controlled to be 0.3 mass % or less.

The glass material may be colored in yellow and cause an absorption of excitation light when PbO exists in the glass material. It is thus preferable that the glass material contains substantially no PbO. More specifically, the content of PbO in the glass material is preferably 0.3 mass % or less, more preferably 0.03 mass % or less.

It is well known that $Bi_2O_3$ has the function of decreasing the softening temperature of the glass material. When $Bi_2O_3$ exists in the glass material, however, there may occur deactivation of the phosphor by reaction of $Bi_2O_3$ with the phosphor. It is thus preferable that the glass material contains substantially no $Bi_2O_3$. More specifically, the content of $Bi_2O_3$ in the glass material is preferably 0.3 mass % or less, more preferably 0.03 mass % or less.

In other words, it is preferable that the glass material is substantially free of PbO and $Bi_2O_3$.

$SiO_2$ is used as a glass forming component in combination with another glass forming component $B_2O_3$ for glass stabilization. The content of $SiO_2$ in the glass material is in the range of 15 to 40 mass %. When the $SiO_2$ content is less than 15 mass %, the glass material is out of the glass composition range where the moisture resistance is improved by the action of BaO etc. When the $SiO_2$ content exceeds 40 mass %, the softening temperature of the glass material tends to become high. The lower limit of the $SiO_2$ content is preferably 20 mass % or higher, more preferably 22 mass % or higher. The upper limit of the $SiO_2$ content is preferably 35 mass % or lower, more preferably 30 mass % or lower.

$B_2O_3$ is used as a glass forming component so as to facilitate melting of the glass material and prevent an excessive increase in the linear expansion coefficient of the glass material. In the present invention, $B_2O_3$ is also used to suppress a decrease in the emission of the phosphor by BaO etc. The content of $B_2O_3$ in the glass material is in the range of 10 to 30 mass %. When the $B_2O_3$ content is less than 10 mass %, the glass material is not vitrified. When the $B_2O_3$ content exceeds 30 mass %, the moisture resistance of the glass material tends to significantly deteriorate. The lower limit of the $B_2O_3$ content is preferably 15 mass % or higher, more preferably 16 mass % or higher. The upper limit of the $B_2O_3$ content is preferably 28 mass % or lower. ZnO is used to decrease the softening temperature of the glass material and improve the moisture resistance of the glass material. The content of ZnO in the glass material is in the range of 1 to 35 mass %. The above effects cannot be expected when the ZnO content is less than 1 mass %. When the ZnO content exceeds 35 mass %, there tends to occur a decrease in the emission of the phosphor. The lower limit of the ZnO content is preferably 3 mass % or higher, more preferably 5 mass % or higher. The upper limit of the ZnO content is preferably 25 mass % or lower, more preferably 18 mass % or lower.

$Al_2O_3$ is used to suppress devitrification of the glass material during melting or sintering. The content of $Al_2O_3$ in the glass material is in the range of 0 to 20 mass %. When the $Al_2O_3$ content exceeds 20 mass %, the glass material decreases in stability. The $Al_2O_3$ content is preferably 15 mass % or less. The lower limit of the $Al_2O_3$ content may preferably be 1 mass % or higher, more preferably 3 mass % or higher.

Further, at least one of BaO, CaO and SrO is contained such that the total content of BaO, CaO and SrO in the glass material is in the range of 2 to 30 mass %. These three components are used to decrease the softening temperature of the glass material and improve the moisture resistance of the glass material. It is feasible to select and use only one kind, or two or more kinds, of these three components. When the total content of BaO, CaO and SrO is less than 2 mass %, the moisture resistance of the glass material may not be sufficiently improved. When the total content of BaO, CaO and SrO exceeds 30 mass %, the glass composition becomes out of balance so that there tends to occur a deterioration in the moisture resistance of the glass material or an increase in the softening temperature of the glass material. The lower limit of the total BaO, CaO and SrO content is preferably 3 mass % or higher, more preferably 6 mass % or higher. The upper limit of the total BaO, CaO and SrO content is preferably 10 mass % or lower, more preferably 25 mass % or lower.

In particular, BaO is effective in improving the moisture resistance of the glass material. It is thus preferable that the content of BaO in the glass material is in the range of 1 to 30 mass %. Although alkaline earth metal oxides, except MgO, have the function of improving the moisture resistance of the glass material, the use of BaO is preferred in that it is possible to easily improve the moisture resistance of the glass material. The lower limit of the BaO content is preferably 2 mass % or higher, more preferably 4 mass % or higher. The upper limit of the BaO content is preferably 25 mass % or lower.

As in the case of BaO, both of CaO and SrO are effective in improving the moisture resistance of the glass material. It is preferable that each of the contents of CaO and SrO in the glass material is in the range of 0 to 20 mass %.

The moisture resistance of the glass material significantly deteriorates when MgO exists in the glass material. Thus, the content of MgO in the glass material is in the range of 0 to 1 mass %. It is preferable that the glass material is substantially free of MgO. When the glass material is substantially free of MgO, it means that the content of MgO is e.g. 1 mass % or less, preferably 0.3 mass % or less, more preferably 0.03 mass % or less.

$R_2O$ (at least one of $Li_2O$, $Na_2O$ and $K_2O$) is used to decrease the softening temperature of the glass material and adjust the linear expansion coefficient of the glass material to within an appropriate range. The content of $R_2O$ in the glass material is in the range of 5 to 35 mass %. When the $R_2O$ content is less than 5 mass %, the softening temperature of the glass material tends to become high. When the $R_2O$ content exceeds 35 mass %, the moisture resistance of the glass material tends to deteriorate due to alkali elution. The $R_2O$ content is preferably 6 to 30 mass %.

Among the above $R_2O$ components, $Li_2O$ has the function of decreasing the softening point of the glass material. There is however a tendency that it becomes difficult to vitrify the glass material as the $Li_2O$ content increases. The content of $Li_2O$ in the glass material is thus preferably 5 mass % or less.

Antimony oxide is assumed to be present in the glass material in the form of $Sb_2O_3$ or $Sb_2O_5$; and tin oxide is assumed to be present in the glass material in the form of $SnO_{(2-x)}$ ($0 \leq x < 2$) such as $SnO_2$ or $SnO$. Both of antimony oxide and tin oxide have the function of suppressing the reactivity of the glass material with the phosphor. When the total content of antimony oxide and tin oxide in the glass material is 0 to 15 mass % in the glass material, it is possible to effectively suppress deactivation of the phosphor by reaction of the phosphor and the glass material due to heat during sintering. The total content of antimony oxide and tin oxide is preferably 0.1 to 12 mass %, more preferably 1 to 10 mass %.

It is preferable that the glass material contains at least 0.1 mass % of each of antimony oxide and tin oxide. Each of the contents of antimony oxide and tin oxide is more preferably in the range of 1 to 15 mass %, still more preferably 1 to 10 mass %.

In addition to the above components, $ZrO_2$ may be added in the glass material so as to suppress devitrification of the glass material during melting or sintering. The content of $ZrO_2$ in the glass material is preferably in the range of 0.1 to 5 mass %. When the $ZrO_2$ content exceeds 5 mass %, the glass material decreases in stability. The $ZrO_2$ content is more preferably 3 mass % or less.

In the present invention, the glass material preferably has a linear expansion coefficient of 6 to 13 ppm/° C. at 30° C. to 300° C. and a softening point of 670° C. or lower. It is possible to effectively suppress deactivation of the phosphor due to heat during sintering by decreasing the softening point of the glass material. Thus, the softening point of the glass material is more preferably 650° C. or lower, still more preferably 630° C. or lower. In view of the fact that the moisture resistance of the glass material may be lowered when the softening point of the glass material becomes too low, it is preferable that the lower limit of the softening point of the glass material is 400° C. or higher.

In general, the phosphor varies in excitation wavelength depending on the components of the phosphor. There is no particular limitation on the kind of the light source employed. Any light source such as LED or LED can be selected and used as appropriate in accordance with the excitation wavelength of the phosphor. In the present invention, the phosphor can be used with no particular limitation when the excitation wavelength of the phosphor is in the range of 350 to 500 nm. Namely, it is preferable in the present invention that the phosphor has an excitation wavelength of 350 to 500 nm.

The phosphor is in the form of particles of preferably at least one kind selected from the group consisting of oxide phosphors, oxynitride phosphors, nitride phosphors, oxysulfide phosphors, sulfide phosphors, aluminate phosphors, halophosphate phosphors, fluoride phosphors and YAG phosphors. The present invention is applicable to the case of using a nitride phosphor, sulfide phosphor or the like that is generally readily deactivated. There can thus suitably be used any of oxide phosphors, oxynitride phosphors, nitride phosphors, oxysulfide phosphors and sulfur phosphors. It is feasible to use two or more kinds of phosphors in combination.

Examples of the nitride phosphors are: red phosphors such as $(Sr, Ca)AlSiN_3$:Eu phosphor and $CaAlSiN_3$:Eu phosphor; and yellow phosphors such as $La_3Si_6N_{11}$:Ce phosphor. Examples of the oxynitride phosphors are: red phosphors such as $CaAlSi(ON)_3$:Eu phosphor, α-Sialon:Eu phosphor; and green phosphors such as β-Sialon:Eu phosphor, $(Sr, Ba)Si_2O_2N_2$:Eu phosphor and $Ba_3Si_6O_{12}N_2$:Eu phosphor.

Examples of the oxide phosphors are: yellow phosphors such as $(Y, Gd)_3Al_5O_{12}$:Ce phosphor, $Tb_3AlO_{12}$:Ce phosphor, $Lu_3Al_5O_{12}$:Ce phosphor and $(Sr, Ca, Ba)_2SiO_4$:Eu phosphor; green phosphors such as $Y_3(Al, Ga)_5O_{12}$:Ce$^{3+}$ phosphor, $(Ba, Sr)_2SiO_4$:Eu phosphor, $CaSc_2O_4$:Ce phosphor, $BaMgAl_{10}O_{17}$:Eu, Mn phosphor, $SrAl_2O_4$:Eu phosphor; and red phosphors such as $(Sr, Ba)_3SiO_5$:Eu phosphor.

Examples of the sulfide phosphors are: green phosphors such as ZnS:Cu, Al phosphor and $(Ca, Sr)Ga_2S_4$:Eu phosphor; red phosphors such as (Ca, Sr)S:Eu phosphor; and infrared phosphors such as (Zn, Cd)S:Cu phosphor. Examples of the oxysulfide phosphors are red phosphors such as $Y_2O_2S$:Eu phosphor, $La_2O_2S$:Eu phosphor and $Gd_2O_2S$:Eu phosphor.

The conversion efficiency (intensity ratio of excitation light and emission light) and emission efficiency of the phosphor-dispersed glass vary depending on the kind and amount of the phosphor particles dispersed in the glass material and the thickness of the phosphor-dispersed glass. The content amount of the phosphor particles and the thickness of the phosphor-dispersed glass are adjusted so as to optimize the emission efficiency and color-rendering properties of the phosphor-dispersed glass. When the content amount of the phosphor particles is too high, there is a problem that: the glass material may become difficult to sinter; or the phosphor particles may not be efficiently irradiated with excitation light. Thus, the content amount of the phosphor particles is preferably in the range of 0.01 to 95 vol % based on the total mass of the phosphor-dispersed glass.

In the present invention, the phosphor-dispersed glass may include an inorganic filler. It is possible by the addition of the inorganic filler to adjust the thermal characteristics such as linear expansion coefficient and softening point of the glass material during sintering. Examples of the inorganic filler are zircon, mullite, silica, titania and alumina. The content amount of the inorganic filler is adjusted as appropriate to within the range of, for example, 0.1 to 40 mass % based on the total amount of the phosphor-dispersed glass.

The phosphor-dispersed glass can be produced by mixing a powder of the glass material with a powder of the phosphor and sintering the glass-phosphor powder mixture. At this time, it is preferable to mix the glass powder with the phosphor powder, form the glass-phosphor powder mixture into a pellet by a non-heating technique such as press molding, and then, sintering the pellet in order to effectively suppress deactivation of the phosphor due to heat. It is alternatively feasible to mix the glass powder with the phosphor powder, once heat the glass-phosphor powder mixture to a viscosity at which the glass-phosphor powder mixture is formable and then form the glass-phosphor powder mixture in a mold.

In the sintering process, the sintering temperature is preferably in the range of 400 to 750° C. When the sintering temperature is higher than 750° C., there is a possibility of degradation of the phosphor, significant deterioration of emission efficiency by reaction of the glass material and the phosphor or the like. Such high-temperature sintering is not suitable for the object of the present invention.

The heating can be performed in an air atmosphere, a reduced pressure or vacuum atmosphere or an atmosphere of inert gas such as nitrogen gas or Ar gas. In view of production cost, the heating is preferably performed in the air. In order to suppress air bubbles in the glass powder, it is feasible to perform the sintering in a reduced pressure or vacuum atmosphere or in a pressurized atmosphere.

For production of the phosphor-dispersed glass, it is preferable that the glass powder is pulverized to a size close to an ordinary particle size (1 to 100 mm) of the phosphor powder. The pulverization is preferably performed by the use of a jet mill pulverizer, which causes less contamination during process step, although it is feasible to perform the pulverization by the use of a mortar or a ball mill.

The phosphor-dispersed glass can be produced by kneading the glass powder and the phosphor powder together with a binder, a solvent etc. and sintering the resulting paste in place of sintering the pellet of the glass-phosphor powder mixture. In the case of producing the phosphor-dispersed glass from the paste, it is feasible to apply the paste to e.g. a substrate and sintering the applied paste at a predetermined temperature. The binder and the solvent are volatilized during sintering and thus do not remain in the phosphor-dispersed glass after sintering.

In addition to the above methods, it is conceivable to produce the phosphor-dispersed glass from a green sheet. In this case, the green sheet is prepared by kneading the glass powder and the phosphor powder together with a plasticizer, a binder, a solvent etc., forming the resulting slurry by a doctor blade process on a film of e.g. polyethylene terephthalate (PET) and drying the formed slurry. The phosphor-dispersed glass is produced by sintering the green sheet.

It is a preferred embodiment of the present invention to provide a light emitting device using the phosphor-dispersed glass in combination with a LED or LD. The light emitting device is usable for a white luminous source or a light source of a projector, a sensor or a laser or the like. In the case of using the phosphor-dispersed glass in the light emitting device, the phosphor is selected so as to secure adequate wavelength conversion performance depending on the purpose of use of the light emitting device.

The phosphor-dispersed glass of the present invention is suitably usable for a white luminous source. When used in the white luminous source, the phosphor-dispersed glass converts a wavelength of emission light from the light source e.g. LED and thereby generates white light by sealing the LED with the phosphor-dispersed glass. The LED can be sealed with the phosphor-dispersed glass by applying or adhering the glass-phosphor powder mixture to the LED and sintering the glass-phosphor powder mixture by heating, or by forming the glass-phosphor powder mixture into a predetermined shape, sintering the formed glass-phosphor body and mounting the sintered glass-phosphor body to the LED via an adhesive material. It is possible to obtain the white luminous source with high color-rendering properties by the use of the phosphor-dispersed glass as a nitride phosphor useful as a red phosphor is encapsulatable in the glass.

The phosphor-dispersed glass of the present invention is also suitably usable a light conversion element of a projector. When used as the light conversion element of the projector, the phosphor-dispersed glass converts a wavelength of emission light from the light source e.g. LED and thereby generates green light, yellow light or red light. The light conversion element can be produced by applying or adhering the glass-phosphor powder mixture to the LED and sintering the glass-phosphor powder mixture by heating, or by forming the glass-phosphor powder mixture into a predetermined shape, sintering the formed glass-phosphor body and mounting the sintered glass-phosphor body to the LED via an adhesive material or placing the sintered glass-phosphor body at a predetermined distance apart from the LED.

EXAMPLES

The present invention will be described in more detail below by way of the following examples and comparative examples.

1. Preparation and Moisture Resistance Evaluation of Glass Powders

Raw material batches were prepared by weighing out and mixing various inorganic raw material compounds such that the raw material batches had respective compositions for glass samples A to P as indicated in TABLES 1 and 2. Each of the raw material batches was put in a crucible of platinum and melted by heating in an electric furnace at 1100 to 1400° C. for 1 to 2 hours, thereby obtaining a glass sample (A to P) as indicated in TABLE 1, 2. A part of the glass sample was fed into a mold and thereby formed into a block for measurement of thermal properties (linear expansion coefficient and softening point). The remainder of the glass sample was processed into a flake form and pulverized by a pulverizer to a glass powder with an average particle size of 1 to 30 μm and a maximum particle size of smaller than 200 μm.

In Examples, tin oxide and antimony oxide were used in the form of $SnO_2$ and $Sb_2O_3$, respectively, as raw material compounds. As tin oxide could be in various oxidation states such as $SnO$ and $SnO_2$ in the glass material, it was difficult to determine the specific oxidation state of tin oxide. Thus, tin oxide was indicated as $SnO_2$ in TABLES 1 and 2. It was also difficult to determine the specific oxidation state of antimony oxide as antimony oxide could be in various oxidation states such as $Sb_2O_3$ and $Sb_2O_5$ in the glass material. Antimony oxide was thus indicated as $Sb_2O_3$ in TABLES 1 and 2. In TABLES 1 and 2, the contents of the respective components were rounded off to the first decimal places so that the apparent sum of the contents might not reach 100.

The average particle size and maximum particle size of the glass powder were measured with a laser diffraction particle size analyzer (Microtrac manufactured by NIK-KISO Co., Ltd.). More specifically, the glass powder was dispersed in water. The resulting glass disperse system was irradiated with laser light to measure scattered/diffracted light. The particle size of the glass powder was determined based on the intensity distribution of the scattered/diffracted light according to a set program of the analyzer.

The softening point of the glass powder was measured with a thermal analyzer TG-DTA (manufactured by Rigaku Corporation). The linear expansion coefficient of the glass powder was measured as an elongation percentage at 30 to 300° C. by heating at 5° C./min with a thermal expansion meter. The sample K in TABLE 2 was not vitrified. The softening point and linear expansion coefficient of this sample were not measured. Further, this sample was not used in the following tests.

<Moisture Resistance Evaluation of Glass Powders>

The above glass powders (samples A to J and L to P) were tested for the moisture resistance by the following method. Herein, the compositions of the glass powders A to H were within the scope of the present invention; and the compositions of the glass powders I to J and L to P were out of the scope of the present invention.

First, each of the glass powders was compressed in a mold and thereby preformed into a button shape with a diameter of 20 mm and a thickness of 2 mm. The preformed glass sample was sintered by heating for 30 minutes in the air. The sintered glass sample was subjected to grinding to a thickness of 1 mm. Before the moisture resistance evaluation test, the ultraviolet-visible light transmittance (550 nm) of the sintered glass sample was measured with a spectrophotometer (U 4000 manufactured by Hitachi Cooperation).

Next, the moisture resistance evaluation test was performed on the sintered glass sample. In the moisture resistance evaluation test, the sintered glass sample was left under the PCT (pressure cooker test) conditions of a temperature of 121° C. and a humidity of 100% for 24 hours, 48 hours, 72 hours or 96 hours. After the moisture resistance evaluation test, the ultraviolet-visible light transmittance of the sintered glass sample was measured in the same manner as above.

Based on the light transmittance measurement results, the rate of decrease of the light transmittance during the moisture resistance evaluation test was determined by the formula: {1−(light transmittance after moisture resistance evaluation test/light transmittance before moisture resistance evaluation test)}×100(%). In the present specification, the moisture resistance was evaluated as: good (◯) when the rate of decrease of the light transmittance was 1% or smaller; and poor (X) when the rate of decrease of the light transmittance exceeded 1%.

The moisture resistance evaluation results are shown, together with the glass compositions and the thermal characteristics measurement results, in TABLES 1 and 2.

TABLE 1

| (Mass %) | A | B | C | D | E | F | G | H |
|---|---|---|---|---|---|---|---|---|
| $SiO_2$ | 26.0 | 27.8 | 27.6 | 27.6 | 26.0 | 24.0 | 24.0 | 25.0 |
| $B_2O_3$ | 18.8 | 19.5 | 19.9 | 19.9 | 18.3 | 17.0 | 24.0 | 26.0 |
| ZnO | 11.8 | 12.6 | 12.5 | 12.5 | 12.0 | 10.8 | 8.8 | 10.0 |
| $Al_2O_3$ | 7.7 | 8.0 | 8.0 | 8.0 | 7.5 | 7.0 | 4.0 | 8.0 |
| BaO | 8.0 | 4.0 | 0.8 | 0.8 | 15.0 | 22.0 | 20.0 | 20.0 |
| CaO | | | 3.0 | | | | | |
| SrO | | | | 4.0 | | | | |
| MgO | | | | | | | | |
| $Li_2O$ | | | | | 1.0 | 1.0 | 1.0 | 4.3 |
| $Na_2O$ | 3.3 | 3.3 | 3.0 | 2.0 | 2.0 | 2.0 | 2.0 | |
| $K_2O$ | 20.1 | 20.5 | 21.0 | 21.0 | 14.0 | 12.0 | 12.0 | 2.5 |
| $Sb_2O_3$ | 1.4 | 1.4 | 1.4 | 1.4 | 1.4 | 1.4 | 1.4 | 1.4 |
| $SnO_2$ | 2.9 | 2.9 | 2.8 | 2.8 | 2.8 | 2.8 | 2.8 | 2.8 |
| BaO + CaO + SrO | 8.0 | 4.0 | 3.8 | 4.8 | 15.0 | 22.0 | 20.0 | 20.0 |
| $Li_2O$ + $Na_2O$ + $K_2O$ | 23.4 | 23.8 | 24.0 | 23.0 | 17.0 | 15.0 | 15.0 | 6.8 |
| Softening point (° C.) | 585 | 590 | 588 | 586 | 570 | 578 | 583 | 580 |
| Linear expansion coefficient (ppm/° C.) | 11.3 | 11.2 | 11.1 | 11.2 | 11.5 | 11.5 | 11.7 | 12.0 |
| Moisture resistance 24 h | ◯ | ◯ | ◯ | ◯ | ◯ | ◯ | ◯ | ◯ |
| 48 h | ◯ | ◯ | ◯ | ◯ | ◯ | ◯ | ◯ | ◯ |
| 72 h | ◯ | ◯ | ◯ | ◯ | ◯ | ◯ | ◯ | ◯ |
| 96 h | ◯ | X | X | X | ◯ | ◯ | ◯ | ◯ |

TABLE 2

| (Mass %) | I | J | K | L | M | N | O | P |
|---|---|---|---|---|---|---|---|---|
| $SiO_2$ | 28.1 | 27.6 | 27.0 | 27.6 | 27.3 | 28.0 | 25.0 | 43.0 |
| $B_2O_3$ | 19.7 | 10.5 | 7.7 | 19.9 | 21.0 | 30.0 | 16.0 | 6.2 |
| ZnO | 12.4 | 22.6 | 22.5 | 12.5 | 11.0 | 9.0 | 8.0 | |
| $Al_2O_3$ | 8.0 | 7.9 | 11.7 | 8.0 | 8.0 | 4.0 | 7.0 | 6.6 |
| BaO | 0.8 | 0.7 | 0.7 | 0.8 | 4.0 | 0.8 | 33.0 | 33.0 |
| CaO | | | | | | | | 4.5 |
| SrO | | | | | | | | |
| MgO | | | | | 2.5 | 7.5 | | |
| $Li_2O$ | | | | | | | | |
| $Na_2O$ | 5.9 | 5.8 | 5.8 | 3.5 | 3.0 | 5.0 | 1.0 | 7.3 |
| $K_2O$ | 20.9 | 20.5 | 20.3 | 21.0 | 14.0 | 19.0 | 6.0 | |
| $Sb_2O_3$ | 1.4 | 1.5 | 1.4 | 1.4 | 1.4 | 1.4 | 1.0 | |
| $SnO_2$ | 2.9 | 2.9 | 2.9 | 2.8 | 2.8 | 2.8 | 3.0 | |
| BaO + CaO + SrO | 0.8 | 0.7 | 0.7 | 0.8 | 4.0 | 0.8 | 33 | 37.5 |
| $Li_2O$ + $Na_2O$ + $K_2O$ | 26.8 | 26.3 | 26.1 | 24.5 | 17.0 | 24.0 | 7 | 7.3 |
| Softening point (° C.) | 568 | 578 | — | 590 | 600 | 568 | 634 | 689 |
| Linear expansion coefficient (ppm/° C.) | 11.6 | 10.8 | — | 10.9 | 10.5 | 10.7 | 9.2 | 8.7 |
| Moisture resistance 24 h | ◯ | ◯ | — | X | X | X | ◯ | ◯ |
| 48 h | ◯ | X | — | X | X | X | ◯ | ◯ |
| 72 h | X | X | — | X | X | X | X | ◯ |
| 96 h | X | X | — | X | X | X | X | X |

Each of the glass powders A to H had a softening point of 570 to 590° C. and a linear expansion coefficient of 11 to 12 ppm/° C. Further, the glass powders A to H and P had good moisture resistance. Anion others, the glass powders A and E to H had better moisture resistance. The moisture resistance of the glass powder P was improved as the total content of BaO and CaO exceeded 30 mass %; and the content of $SiO_2$ as a glass forming component was high. On the other hand, the glass powder P had a high softening point of 689° C. The glass powder P was thus not suitable for the present invention due to the fact that the phosphor is likely to be deactivated when the softening point of the glass powder is high.

The glass powder I was similar in composition to the glass powders A to D, except that the contents of BaO, CaO and SrO were low in the glass powder I, but was low in moisture resistance. As compared to the glass powder I, the glass powder J had a lower content of $B_2O_3$ that tends to cause a deterioration of moisture resistance and a higher content of ZnO that tends to provide an improvement of moisture resistance. Although the glass powder J was higher in moisture resistance than the glass powder I, the moisture resistance of the glass powder J was not sufficiently improved as compared to those of the glass powders A to H and P. It has been shown by these results that it is possible to effectively improve the moisture resistance of the glass powder with the addition of BaO, CaO and SrO.

The glass powder L was similar in composition to the glass powders A to D, except that MgO was contained as the alkaline-earth metal component, but was significant low in moisture resistance. The glass powder M had a higher content of BaO and a higher content of MgO than those of the glass powder L. However, the moisture resistance of the glass powder M was not improved as compared to that of the glass powder L. It has been shown by these results that the moisture resistance of the glass powder significantly deteriorates with the addition of MgO.

The glass powder N had a higher content of $B_2O_3$ than that of the glass powder I. It has been confirmed by this sample that the moisture resistance of the glass powder deteriorates with increase in the content of $B_2O_3$. Although the glass powder O had a BaO content of 30 mass % or more and was relatively similar in composition to the glass powders E to H, the moisture resistance of the glass powder O was not sufficiently improved. It has thus been shown that the moisture resistance of the glass powder deteriorates when the BaO content of the glass powder becomes too high.

2. Production and Evaluation of Phosphor-Dispersed Glasses

Phosphor-dispersed glasses were produced using the above glass powders by the following method in order to examine whether the respective glass powders were actually usable for phosphor-dispersed glasses. First, powder mixtures were prepared by various phosphors (oxide phosphor: 4 vol % or nitride phosphor: 4 vol %) with the glass powders (A to J and L to P) of TABLES 1 and 2. Further, a powder mixture was prepared by mixing 16.0 vol % of sulfide phosphor with the glass powder A. Next, each of the prepared powder mixtures was compressed in a mold and thereby preformed into a button shape with a diameter of 10 mm and a thickness of 2 mm. The preformed glass sample was sintered by heating for 30 minutes in the air. The sintered glass sample using the oxide phosphor or the nitride phosphor was subjected to grinding to a thickness of 1 mm. The sintered glass sample using the sulfide phosphor was subjected to grinding to a thickness of 0.5 mm. The thus-obtained sintered glass samples were tested for the emission efficiency. Herein, the glass powders J, J and L to P were Comparative Examples.

<Measurement of External Quantum Efficiency>

The sintered glass samples using $Y_3Al_5O_{12}$:$Ce^{3+}$ phosphor (luminescence center: 555 nm) as the oxide phosphor or using (Sr, Ca)$AlSiN_3$:$Eu^{2+}$ phosphor (luminescence center: 610 nm) as the nitride phosphor was tested for the external quantum efficiency by the following method.

Excitation and fluorescence spectra of the glass samples were measured by the use of a spectrophotofluorometer (FP6500 available from JASCO Corporation) with an integrating sphere (ILF-533 available from JASCO Corporation). The external quantum efficiency of the phosphor was determined as C/A with the proviso that, in the excitation and fluorescence spectra, A was the integrated intensity of excitation light incident to the integrating sphere; and C was the integrated intensity of fluorescence emitted from the sample.

<Emission Evaluation of Sulfide Phosphor>

As it was impossible by the above measurement device to test the sintered glass sample using (Zn, Cd)S:Cu phosphor (luminescence center: 850 nm) as the sulfide phosphor, the emission of the phosphor was simply tested by the following method.

A blue LED was excited with a current of 300 mA so as to irradiate light (emission peak wavelength: 445 nm) onto one side of the phosphor-dispersed glass. Then, light emitted from the other side of the phosphor-dispersed glass was projected into a calibrated integrating sphere and introduced into a small-side spectroscope (HR-4000 manufactured by Ocean Optics, Inc.) through an optical fiber. By this spectroscope, an emission spectrum (energy distribution curve) of the glass sample was observed. The integrated intensity of the spectrum of fluorescence from the glass sample was calculated. The radiant flux of the fluorescence spectrum was determined based on the calculation result.

For comparison, a button-shaped sample was formed with a diameter of 10 mm and a thickness of 0.5 mm by dispersing 16 vol % of (Zn, Cd)S:Cu phosphor in silicone. An emission spectrum of the formed sample was measured in the same manner as that of the above phosphor-dispersed glass sample. As a result, the radiant flux of the sintered glass sample using the glass powder A was 9.65 uW; and the radiant flux of the formed sample using the silicon was 7.31 uW. The ratio of the radiant flux of the sintered glass sample to the radiant flux of the formed sample was 132%.

The above evaluation results are shown in TABLE 3.

TABLE 3

| | Glass | Sintering temperature ° C. | External quantum efficiency % | | Radiant flux ratio % |
| --- | --- | --- | --- | --- | --- |
| | | | Oxide phosphor | Nitride phosphor | Sulfide phosphor |
| Example | A | 620 | 75 | 49 | 132 |
| | B | 625 | 75 | 48 | — |
| | C | 625 | 75 | 48 | — |
| | D | 625 | 75 | 47 | — |
| | E | 605 | 75 | 48 | — |
| | F | 615 | 75 | 48 | — |
| | G | 620 | 75 | 48 | — |
| | H | 615 | 75 | 48 | — |
| Comparative Example | I | 605 | 75 | 48 | — |
| | J | 615 | 72 | 40 | — |
| | L | 625 | 75 | 47 | — |
| | M | 635 | 75 | 39 | — |
| | N | 605 | 75 | 46 | — |
| | O | 670 | 75 | 38 | — |
| | P | 740 | 75 | 15 | — |

In the respective Examples and Comparative Examples, the oxide phosphor glass sample had good emission efficiency as the external quantum efficiency of the oxide phosphor was 72% or higher. On the other hand, the external quantum efficiency of the nitride phosphor was 47 to 49% in Examples; and the external quantum efficiency of the nitride phosphor was 15 to 48% in Comparative Examples. Among the Comparative Examples, the nitride phosphor glass samples using the glass powders I, L and N had emission efficiency equivalent to those of the Examples. However, these nitride phosphor glass samples were not suitable for the object of the present invention as the glass powders I, L and N were poor in moisture resistance. In the glass samples of Comparative Examples using the glass powders I, L and N, the external quantum efficiency of the nitride phosphor was slightly lowered; and the glass powders I, L and N were poor in moisture resistance. Although the glass powder P had good moisture resistance, the softening point of the glass powder P was high so that there occurred deactivation of the nitride phosphor in the glass sample using the glass powder P.

Furthermore, the radiant flux of the phosphor-dispersed glass was greater than that of the sulfide phosphor silicon sample. Herein, the term "radiant flux" refers to a value indicating the amount of radiation energy flowing through a certain area per unit time. The value of the radiant flux decreases upon deactivation of the phosphor. It has been shown by the above results that there does not occur deactivation of the phosphor within the glass composition range of the present invention.

3. Moisture Resistance Evaluation of Phosphor-Dispersed Glasses

The following tests were performed in order to examine whether, in the case of producing the phosphor-dispersed glass using high moisture-resistant glass powder, the phosphor-dispersed glass could actually show high moisture resistance. Among the above Examples, the phosphor-dispersed glass using the glass powder A and having dispersed therein the oxide phosphor and the phosphor-dispersed glass using the glass powder A and having dispersed therein the nitride phosphor were employed as test samples. The moisture resistance evaluation test was performed on these samples.

In the moisture resistance evaluation test, the sintered glass sample was left under the PCT (pressure cooker test) conditions of a temperature of 121° C. and a humidity of 100% for 96 hours. After the moisture resistance evaluation test, the external quantum efficiency of the phosphor was measured in the same manner as above. The rate of decrease of the external quantum efficiency during the moisture resistance evaluation test was determined by the formula: {1−(external quantum efficiency after moisture resistance evaluation test/external quantum efficiency before moisture resistance evaluation test)}×100(%). In the present specification, the moisture resistance was evaluated as good when the rate of decrease of the external quantum efficiency was 5% or smaller.

Further, sintered glass samples were each obtained by mixing the glass powder A and the oxide phosphor or nitride phosphor (each 4 mass %) with an inorganic filler ($SiO_2$; 2 mass %) and sintering the powder mixture in the same manner as above. The thus-obtained sintered glass samples were tested for the external quantum efficiency and moisture resistance in the same manner as above.

The above test results are shown in TABLE 4.

TABLE 4

| | Oxide phosphor | | | Nitride phoshor | | |
|---|---|---|---|---|---|---|
| | Before test | After test | Decrease rate | Before test | After test | Decrease rate |
| Example | 75% | 75% | 0% | 49% | 48% | 2% |
| $SiO_2$ filler | 75% | 75% | 0% | 49% | 49% | 0% |

It has been shown by the above results that: the phosphor-dispersed glass shows good moisture resistance during actual use; and there arises no loss of moisture resistance even with the addition of the filler into the phosphor-dispersed glass.

The invention claimed is:

1. A phosphor-dispersed glass, comprising: a glass material; and a phosphor dispersed in the glass material,
    wherein the glass material is substantially free of $Nb_2O_5$ and contains:
    15 to 40 mass % of $SiO_2$;
    10 to 30 mass % of $B_2O_3$;
    1 to 35 mass % of ZnO;
    0 to 20 mass % of $Al_2O_3$;
    2 to 30 mass % in total of at least one kind selected from the group consisting of BaO, CaO and SrO;
    0 to 1 mass % of MgO;
    5 to 35 mass % in total of $R_2O$ (at least one selected from the group consisting of $Li_2O$, $Na_2O$ and $K_2O$); and
    0 to 15 mass % in total of at least one of antimony oxide and tin oxide.

2. The phosphor-dispersed glass according to claim 1, wherein BaO is contained in an amount of 1 to 30 mass % in the glass material.

3. The phosphor-dispersed glass according to claim 1, wherein each of antimony oxide and tin oxide is contained in an amount of at least 0.1 mass % in the glass material.

4. The phosphor-dispersed glass according to claim 1, wherein the glass material has a linear expansion coefficient of 6 to 13 ppm/° C.
    at 30° C. to 300° C. and a softening temperature of 670° C. or lower.

5. The phosphor-dispersed glass according to claim 1, wherein the phosphor is at least one kind selected from the group consisting of oxide phosphors, oxynitride phosphors, nitride phosphors, oxysulphide phosphors, sulfide phosphors, aluminate phosphors, halophosphate phosphors, fluoride phosphors and YAG phosphors.

6. The phosphor-dispersed glass according to claim 1, further comprises an inorganic filler.

7. A light emitting device, comprising: the phosphor-dispersed glass according to claim 1; and either a light emitting diode or a laser diode.

* * * * *